United States Patent
Nguyen et al.

(10) Patent No.: US 8,193,836 B2
(45) Date of Patent: Jun. 5, 2012

(54) TECHNIQUES FOR MEASURING VOLTAGES IN A CIRCUIT

(75) Inventors: Andy Nguyen, San Jose, CA (US); Ling Yu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/103,832

(22) Filed: May 9, 2011

(65) Prior Publication Data

US 2011/0204924 A1 Aug. 25, 2011

Related U.S. Application Data

(62) Division of application No. 12/105,262, filed on Apr. 17, 2008, now Pat. No. 7,944,248.

(51) Int. Cl.
*H03K 5/22* (2006.01)

(52) U.S. Cl. ............... 327/73; 327/72; 327/77; 327/87

(58) Field of Classification Search .................. 327/72, 327/73, 77, 78, 87–89
See application file for complete search history.

(56) References Cited

U.S. PATENT DOCUMENTS

| | | | |
|---|---|---|---|
| 6,377,083 B1 | 4/2002 | Takabayashi et al. | |
| 7,133,751 B2 | 11/2006 | Kurd et al. | |
| 7,199,645 B2 * | 4/2007 | Chang et al. | 327/538 |
| 7,276,925 B2 | 10/2007 | Dobberpuhl et al. | |
| 7,410,293 B1 | 8/2008 | Santurkar et al. | |
| 7,944,248 B2 * | 5/2011 | Nguyen et al. | 327/73 |
| 2004/0222827 A1 * | 11/2004 | Degoirat et al. | 327/143 |
| 2006/0190746 A1 * | 8/2006 | Boerstler et al. | 713/300 |

OTHER PUBLICATIONS

"Written Opinion of the International Searching Authority," Korean Intellectual Property Office, Nov. 30, 2009, pp. 1-11.

* cited by examiner

*Primary Examiner* — Long Nguyen
(74) *Attorney, Agent, or Firm* — Steven J. Cahill (57) ABSTRACT

A circuit includes a comparator, a resistor divider, a control circuit, a multiplexer, and a programmable gain amplifier. The comparator is operable to measure an internal voltage of the circuit based on a selected reference voltage. The resistor divider is operable to generate reference voltages. The control circuit is operable to generate a select signal based on an output signal of the comparator. The multiplexer is operable to select one of the reference voltages from the resistor divider as the selected reference voltage based on the select signal. The programmable gain amplifier is configurable to generate a compensation voltage to compensate for an offset voltage of the comparator. The compensation voltage is provided to an input of the comparator.

20 Claims, 7 Drawing Sheets

TECHNIQUES FOR MEASURING VOLTAGES IN A CIRCUIT

CROSS REFERENCE TO RELATED APPLICATION

This application is a divisional of U.S. patent application Ser. No. 12/105,262, filed Apr. 17, 2008, now U.S. Pat. No. 7,944,248, which is incorporated by reference herein in its entirety.

FIELD OF THE INVENTION

The present invention relates to electronic circuits, and more particularly, to techniques for measuring voltages in a circuit.

BACKGROUND OF THE INVENTION

A supply voltage is transmitted to circuit blocks in an integrated circuit. The supply voltage supplies charge to circuit blocks in the integrated circuit.

BRIEF SUMMARY OF THE INVENTION

According to some embodiments of the present invention, a circuit includes a comparator, a resistor divider, a control circuit, a multiplexer, and a programmable gain amplifier. The comparator is operable to measure an internal voltage of the circuit based on a selected reference voltage. The resistor divider is operable to generate reference voltages. The control circuit is operable to generate a select signal based on an output signal of the comparator. The multiplexer is operable to select one of the reference voltages from the resistor divider as the selected reference voltage based on the select signal. The programmable gain amplifier is configurable to generate a compensation voltage to compensate for an offset voltage of the comparator. The compensation voltage is provided to an input of the comparator.

According to other embodiments of the present invention, a circuit includes a comparator, a programmable current source, and a control circuit. The comparator compares an internal supply voltage of the circuit to a reference voltage. The programmable current source supplies charge for the reference voltage. The control circuit receives an output signal of the comparator and generates control signals for controlling current through the programmable current source.

Various objects, features, and advantages of the present invention will become apparent upon consideration of the following detailed description and the accompanying drawings.

DETAILED DESCRIPTION OF THE INVENTION

Figure 1:
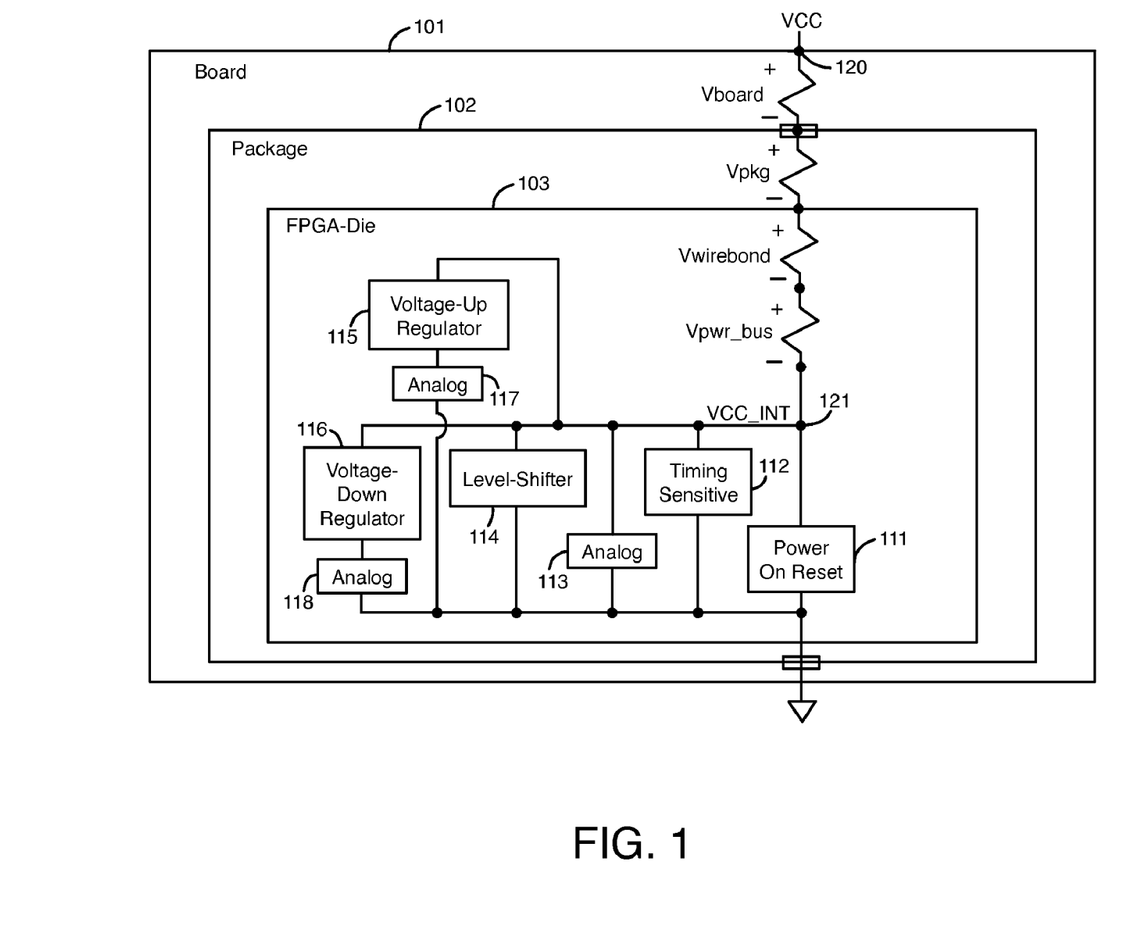
FIG. 1 illustrates an example of how various components can cause a supply voltage to experience a voltage drop before the supply voltage is provided to circuit blocks in an integrated circuit.

FIG. 1 illustrates an example of how various components can cause a supply voltage to experience a voltage drop before the supply voltage is provided to circuit blocks in an integrated circuit. In FIG. 1, circuit board 101 includes a field programmable gate array (FPGA) integrated circuit die 103 that is housed in package 102. FPGA die 103 includes numerous circuit blocks. Only a small fraction of these circuit blocks are shown in FIG. 1. FIG. 1 illustrates examples of the circuit blocks in FPGA die 103 including power on reset (POR) block 111, a timing sensitive block 112, level-shifter circuit 114, voltage-up regulator 115, voltage-down regulator 116, and analog circuit blocks 113, 117, and 118. The timing sensitive block 112 can include circuitry that operates at a slower rate in response to a reduced supply voltage VCC.

FPGA die 103 typically receives multiple supply voltages. Different supply voltages can, for example, be provided to input/output (I/O) blocks, pre-driver circuits, programmable logic blocks in the core of the FPGA, phase-locked loops, delay-locked loops, and other circuit blocks on FPGA die 103. According to some embodiments of the present invention, any supply voltage can be measured from an internal node of an FPGA or application specific integrated circuit (ASIC) die.

Supply voltage VCC is supplied from a supply voltage source to FPGA die 103 through board 101 and package 102. The supply voltage VCC experiences voltage drops Vboard and Vpkg while being transmitted from node 120 through wires in board 101 and package 102. Once inside FPGA 103, supply voltage VCC experiences additional voltage drops Vwirebond and Vpwr_bus, while being transmitted through wire bonds and a power bus, respectively, in FPGA die 103 before reaching internal node 121. The internal supply voltage VCC_INT at internal node 121 may have a significant voltage drop relative to the supply voltage VCC generated by the supply voltage source at node 120. Alternatively, the supply voltage VCC can be supplied from a voltage regulator inside the integrated circuit die.

In the example of FIG. 1, supply voltage VCC_INT at node 121 drives POR block 111, timing sensitive block 112, analog block 113, level-shifter block 114, voltage-up regulator 115, and voltage-down regulator 116. The voltage drop of VCC at node 121 can adversely affect (e.g., slow down) the operation of these circuit blocks and other circuit blocks in FPGA die 103. The supply voltage source can be programmed to compensate for the supply voltage drop between nodes 120 and 121 if the internal supply voltage VCC_INT at node 121 is known. However, process variations between FPGA integrated circuit dies that have the same FPGA architecture can cause the supply voltage VCC_INT at node 121 to vary from die to die. Also, temperature variations can cause VCC_INT at node 121 to vary within a single FPGA die. Thus, directly measuring the internal supply voltage VCC_INT at internal node 121 in one FPGA die at one time often does not provide an accurate indication of VCC_INT at node 121 in other FPGA dies that have the same FPGA architecture or within the same FPGA die at a different temperature.

According to some embodiments of the present invention, techniques are provided for measuring the supply voltage at an internal node of an integrated circuit so that any voltage drop in the supply voltage can be compensated for by the supply voltage source. Some embodiments of the present invention can be used to measure the supply voltage at an internal node of an integrated circuit in each integrated circuit die that is manufactured, so that the supply voltage at the internal node can be determined accurately regardless of process variations between the integrated circuit dies. Some embodiments of the present invention can be used to measure the supply voltage at an internal node of an integrated circuit at different points in time during the operation of the integrated circuit, so that the supply voltage at the internal node can be determined accurately regardless of temperature variations of the integrated circuit.

Figure 2:
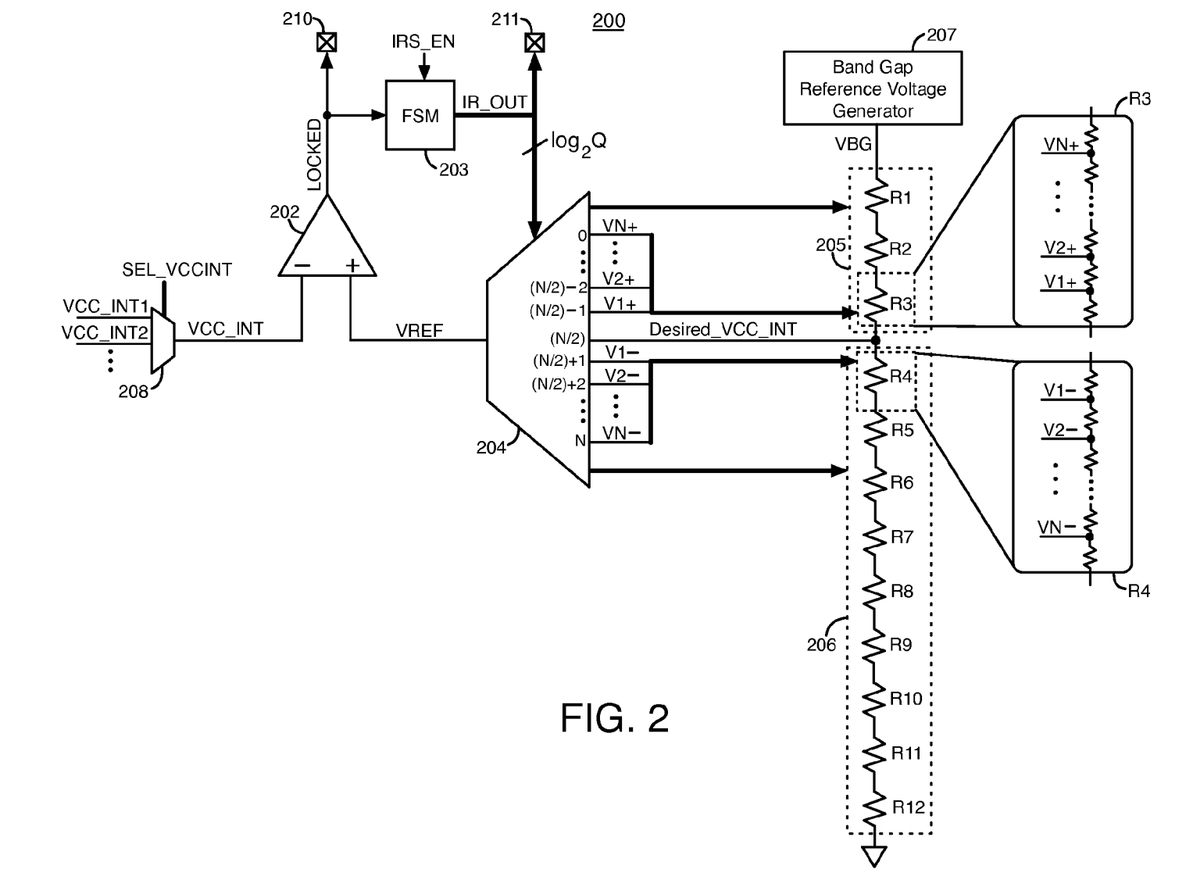
FIG. 2 illustrates an example of a circuit that measures the supply voltage at an internal node of an integrated circuit, according to an embodiment of the present invention.

FIG. 2 illustrates an example of a circuit 200 that measures the supply voltage at an internal node inside an integrated circuit, according to an embodiment of the present invention. Measuring circuit 200 in FIG. 2 includes voltage comparator 202, finite state machine (FSM) 203, multiplexer 204, resistor group 205, resistor group 206, band gap reference voltage generator 207, and multiplexer 208. Measuring circuit 200 is typically fabricated on an integrated circuit, such as a programmable integrated circuit or an application specific integrated circuit (ASIC). Programmable integrated circuits include FPGAs, programmable logic devices (PLDs), and programmable logic arrays.

Circuit 200 measures a supply voltage of the integrated circuit that circuit 200 is fabricated on.

Comparator 202 receives a selected reference voltage VREF from multiplexer 204 at its non-inverting (+) input terminal. Comparator 202 receives an internal supply voltage VCC_INT from an internal node of the integrated circuit at its inverting (−) input terminal. Comparator 202 compares selected reference voltage VREF to an internal supply voltage VCC_INT of the integrated circuit that contains circuit 200. Comparator 202 can be, for example, an operational amplifier that does not consume current at its input terminals.

Multiplexer 208 is programmed to select the internal supply voltage VCC_INT from an internal supply voltage node inside the integrated circuit containing circuit 200. Multiplexer 208 receives internal supply voltages from two or more internal supply voltage nodes in the integrated circuit. Multiplexer 208 can be programmed to select supply voltage VCC_INT1 from a first internal supply voltage node, supply voltage VCC_INT2 from a second internal supply voltage node, or another internal supply voltage from a different node. One or more select signals SEL_VCCINT are transmitted to the select input terminals of multiplexer 208. Multiplexer 208 selects one of the internal supply voltages in response to the logic states of the SEL_VCCINT signals. The SEL_VCCINT select signals can be generated by FSM 203 or by another control circuit.

The output voltage of comparator 202 is a digital LOCKED signal. The output voltage of comparator 202 is in a logic high state when the selected reference voltage VREF is equal to the internal supply voltage VCC_INT. The output voltage of comparator 202 is in a logic low state when the selected reference voltage VREF is not equal to the internal supply voltage VCC_INT.

Multiplexer 204 selects the reference voltage VREF from a resistor divider formed by resistor groups 205 and 206. The resistor divider formed by resistor groups 205 and 206 functions as a voltage divider. The voltage between resistor groups 205 and 206 is Desired_VCC_INT=VBG*($R_{206}$/($R_{206}$+$R_{205}$)). In the example of FIG. 2, resistor group 205 has 3 resistors R1-R3, and resistor group 206 has 9 resistors R4-R12. Resistors R1-R12 are coupled together in series. Resistors R1-R12 can be, for example, polysilicon resistors or transistors coupled to function as resistors.

The resistor divider formed by resistors R1-R12 generates multiple reference voltages. A reference voltage is generated between each of the resistors R1-R12. For example, a first reference voltage is generated between resistors R1 and R2, a second reference voltage is generated between resistors R2 and R3, a third reference voltage is generated between resistors R3 and R4, a fourth reference voltage is generated between resistors R4 and R5, etc. The reference voltages generated by resistor divider R1-R12 are transmitted to input terminals of multiplexer 204. Multiplexer 204 selects one of the reference voltages at its input terminals from resistors R1-R12 as the selected reference voltage VREF.

Band gap reference voltage generator 207 generates a constant band gap reference voltage VBG that remains at substantially the same voltage across an expected range of process, supply voltage, and temperature variations of the integrated circuit. The band gap reference voltage VBG from band gap reference voltage generator 207 is applied across resistor groups 205 and 206. Resistor R12 in group 206 receives a ground voltage, and resistor R1 in group 205 receives VBG.

Although the resistances of resistors R1-R12 change in response to process and temperature variations of the integrated circuit, the ratios of resistors R1-R12 remain constant, because process and temperature variations typically change the resistances of resistors R1-R12 by the same amount. Because the band gap reference voltage VBG and the ratios of resistors R1-R12 remain constant across temperature, process, and supply voltage variations, the reference voltages generated by resistors R1-R12 are constant over temperature, process, and supply voltage variations in the integrated circuit. The reference voltages provided to the input terminals of multiplexer 204 from resistors R1-R12 remain substantially the same over an expected range of temperature, process, and supply voltage variations in the integrated circuit.

The reference voltage generated by the resistor divider between resistors R3 and R4 is the desired internal supply voltage Desired_VCC_INT in the embodiment of FIG. 2. For example, if VBG is 1.2 volts, and resistors R1-R12 all have the same resistance, then Desired_VCC_INT equals 0.9 volts. The desired internal supply voltage Desired_VCC_INT is transmitted to input terminal N/2 of multiplexer 204.

To increase the precision of measuring circuit 200 near the desired internal supply voltage Desired_VCC_INT, resistors R3 and R4 can each generate multiple reference voltages. Resistor R3 can comprise an (N+1) number of smaller resistors that can generate an N number of reference voltages V1+, V2+, . . . , VN+, as shown in FIG. 2. A unique reference voltage is generated between each adjacent pair of two smaller resistors in R3. Alternatively, resistor R3 can be a single polysilicon resistor, and the N reference voltages can be generated from N equally spaced contacts along the length of resistor R3.

The reference voltages generated from resistor R3 are incremental voltages. Each incremental reference voltage from R3 represents an increase of a fixed voltage relative to a lower reference voltage. For example, resistor R3 can generate 9 reference voltages of 0.91, 0.92, 0.93, 0.94, 0.95, 0.96, 0.97, 0.98, and 0.99 volts that represent increments of 10 millivolts (mV). In this example, a reference voltage of 1.00 volts is generated at the node between resistors R2 and R3. Reference voltages V1+, V2+, ..., VN+ are transmitted from resistor R3 to the (N/2)−1, (N/2)−2, ..., 0 input terminals of multiplexer 204, respectively.

Resistor R4 can comprise an N+1 number of smaller resistors that can generate an N number of reference voltages V1−, V2−, ..., VN−, as shown in FIG. 2. A unique reference voltage is generated between each adjacent pair of two smaller resistors in R4. Alternatively, resistor R4 can be a single polysilicon resistor, and the N reference voltages can be generated from N equally spaced contacts along the length of resistor R4.

The reference voltages generated from resistor R4 are also incremental voltages.

Each incremental reference voltage from R4 represents an increase of a fixed voltage relative to a lower reference voltage. For example, resistor R4 can generate 9 reference voltages of 0.81, 0.82, 0.83, 0.84, 0.85, 0.86, 0.87, 0.88, and 0.89 volts that represent increments of 10 millivolts (mV). Reference voltages V1−, V2−, ..., VN− are transmitted from resistor R4 to the (N/2)+1, (N/2)+2, ..., N input terminals of multiplexer 204, respectively. Multiplexer 204 also has additional input terminals for receiving reference voltages generated between resistors R1-R3 and R4-R12.

The N reference voltages generated from resistor R3 and the N reference voltages generated from resistor R4 also remain at substantially the same voltages over an expected range of process, supply voltage, and temperature (PVT) variations of the integrated circuit, because the band gap reference voltage VBG and the resistance ratios of resistors R1-R12 (including the smaller resistors in R3 and R4) remain constant over the expected range of PVT variations.

Finite state machine (FSM) 203 receives the LOCKED output voltage from comparator 202 at a first input terminal of FSM 203. FSM 203 also receives an enable signal IRS_EN at a second input terminal of FSM 203. FSM 203 functions as a control circuit that generates a set of digital select signals IR_OUT at its output terminals. The number of IR_OUT select signals generated by FSM 203 equals $\log_2 Q$. Q equals the number of input terminals of multiplexer 204 that receive reference voltages from resistor groups 205 and 206, and log refers to a logarithm function.

The IR_OUT select signals generated by FSM 203 are transmitted to the select input terminals of multiplexer 204. Multiplexer 204 selects one of the Q reference voltages from the resistor divider formed by resistors R1-R12 based on the digital logic states of the IR_OUT select signals. Multiplexer 204 transmits the selected reference voltage from the resistor divider formed by resistors R1-R12 to the non-inverting input terminal of comparator 202 as selected reference voltage VREF.

FSM 203 can be, for example, a counter circuit. When FSM 203 senses a logic low state in the IRS_EN signal, FSM 203 may reset the binary value of its IR_OUT output signals to zero. Thus, each of the output signals of FSM 203 is in a logic low state when IRS_EN is low.

To begin the operation of measuring circuit 200, the logic state of the IRS_EN enable signal is changed from a logic low state to a logic high state. After FSM 203 senses a logic high state in the IRS_EN signal, FSM 203 beings to increase the binary value of its IR_OUT output signals. FSM 203 increases the binary value of its IR_OUT output signals by 1 in each subsequent time interval to generate a sequence of increasing binary values. For example, FSM 203 can increase the IR_OUT output signals from 00001, to 00010, to 00011, to 00100, to 00101, to 00111, to 01000, to 01001 etc.

Alternatively, FSM 203 can be programmed to initially reset the binary value of the IR_OUT signals to a predefined maximum value (e.g., all 1s) in response to the IRS_EN enable signal being in a logic low state. After the IRS_EN enable signal changes to a logic high state, FSM 203 decreases the binary value of its IR_OUT output signals by 1 in each subsequent time interval to generate a sequence of decreasing binary values.

Each unique binary value of the IR_OUT select signals causes multiplexer 204 to select a unique reference voltage from resistors R1-R12 as the selected reference voltage VREF. FSM 203 generates a sequence of binary values of the IR_OUT select signals that cause multiplexer 204 to select the reference voltages generated by resistors R1-R12 as VREF in increasing order or in decreasing order. For example, an IR_OUT binary value of 00001 may cause multiplexer 204 to select the smallest reference voltage generated by R1-R12 as VREF, an IR_OUT binary value of 00010 may cause multiplexer 204 to select the second smallest reference voltage generated by R1-R12 as VREF, an IR_OUT binary value of 00011 may cause multiplexer 204 to select the third smallest reference voltage generated by R1-R12 as VREF, etc. As another example, an IR_OUT binary value of 00001 may cause multiplexer 204 to select the largest reference voltage generated by R1-R12 as VREF, an IR_OUT binary value of 00010 may cause multiplexer 204 to select the second largest reference voltage generated by R1-R12 as VREF, an IR_OUT binary value of 00011 may cause multiplexer 204 to select the third largest reference voltage generated by R1-R12 as VREF, etc.

Multiplexer 204 causes the selected reference voltage VREF to equal reference voltages generated by resistors R1-R12 in response to the IR_OUT signals. Multiplexer 204 can cause VREF to increase from the smallest reference voltage to the larger reference voltages generated by resistors R1-R12 in increasing order. Alternatively, multiplexer 204 can cause VREF to decrease from the largest reference voltage to the smaller reference voltages generated by resistors R1-R12 in decreasing order.

The LOCKED output voltage of comparator 202 changes from a logic low state to a logic high state after VREF becomes equal to VCC_INT. After the LOCKED output voltage of comparator 202 changes states from a logic low to a logic high, FSM 203 stops changing the logic states of the IR_OUT signals, and FSM 203 maintains the logic states of the IR_OUT signals constant. The logic states of the IR_OUT signals remain constant until the IRS_EN enable signal changes to a logic low state, which resets the IR_OUT signals.

When the LOCKED output voltage of comparator 202 is in a logic high state, the binary value of the IR_OUT signals generated by FSM 203 indicates the reference voltage that equals (or approximately equals) the internal supply voltage VCC_INT. The reference voltage selected by multiplexer 204 from resistors R1-R12 when the LOCKED output voltage of comparator 202 is in a logic high state equals (or approximately equals) the internal supply voltage VCC_INT.

The IR_OUT select signals generated by FSM 203 are transmitted to external input/output (I/O) pins 211 of the integrated circuit. The LOCKED output voltage generated by comparator 202 is transmitted to external I/O pin 210 of the integrated circuit. The IR_OUT and LOCKED signals do not need to be driven to dedicated pins.

For example, in an FPGA, the LOCKED and IR_OUT signals can be transmitted to I/O pins 210-211 through multiplexers in input/output elements (IOEs) that are also configurable to transmit signals from programmable logic blocks to pins 210-211. Measuring circuit 200 can be used to measure VCC_INT during the user mode of an FPGA.

A user of the integrated circuit can measure the voltages of the IR_OUT signals at IR_OUT pins 211 after the LOCKED signal from comparator 202 changes states from a logic low to a logic high at pin 210 to determine the value of the internal supply voltage VCC_INT. As mentioned above, each unique binary value of the IR_OUT select signals causes multiplexer 204 to select a unique reference voltage from resistors R1-R12. After the LOCKED output voltage of comparator 202 changes state from a logic low to a logic high, the logic states of the IR_OUT select signals correspond to a reference voltage that equals (or approximately equals) VCC_INT. The precise value of the internal supply voltage VCC_INT may be between the final reference voltage VREF selected by multiplexer 204 and the second to last reference voltage VREF selected by multiplexer 204.

Figure 3:
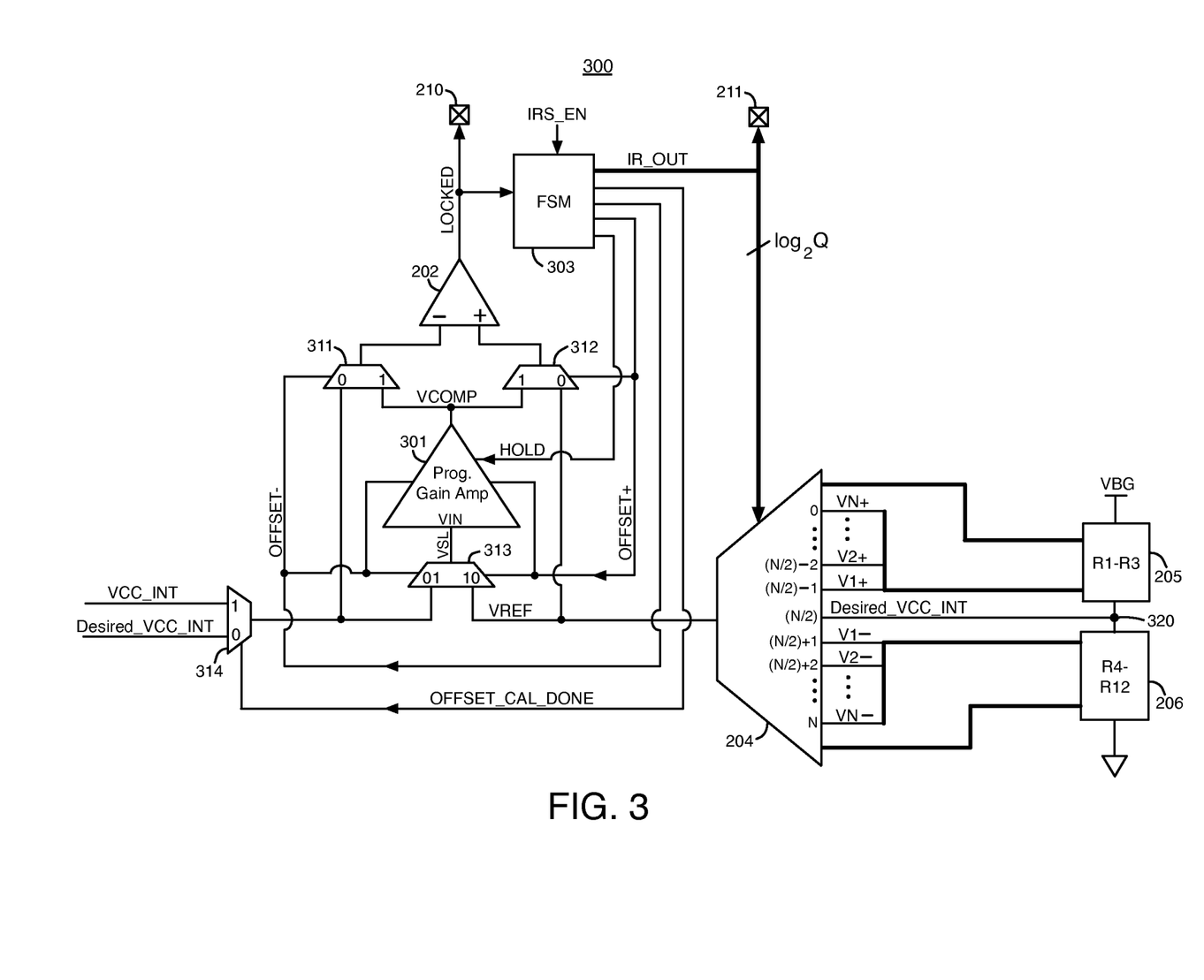
FIG. 3 illustrates an example of a circuit that measures an internal supply voltage inside an integrated circuit using a comparator and that compensates for a voltage offset between the input terminals of the comparator, according to an embodiment of the present invention.

FIG. 3 illustrates an example of a circuit that measures an internal supply voltage inside an integrated circuit using a comparator and that compensates for a voltage offset between the input terminals of the comparator, according to an embodiment of the present invention. Measuring circuit 300 in FIG. 3 includes comparator 202, finite state machine 303, multiplexer 204, resistor group 205, resistor group 206, a programmable unity gain amplifier 301, and multiplexers 311-314. Measuring circuit 300 is typically fabricated on an integrated circuit, such as an ASIC or programmable integrated circuit.

Finite state machine (FSM) 303 functions as a control circuit that generates a set of output select signals IR_OUT. FSM 303 also generates four calibration signals. FSM 303 generates calibration signals OFFSET+, OFFSET−, HOLD, and OFFSET_CAL_DONE. The OFFSET+ calibration signal is transmitted to the select input terminal of multiplexer 312, to the first select input terminal of multiplexer 313, and to the first programmable input terminal of amplifier 301. The OFFSET− calibration signal is transmitted to the select input terminal of multiplexer 311, to the second select input terminal of multiplexer 313, and to the second programmable input terminal of amplifier 301. The HOLD calibration signal is transmitted to a hold input terminal of amplifier 301. The OFFSET_CAL_DONE calibration signal is transmitted to the select input terminal of multiplexer 314. An internal supply voltage VCC_INT is transmitted to the 1 input terminal of multiplexer 314, and a desired internal supply voltage Desired_VCC_INT is transmitted to the 0 input terminal of multiplexer 314.

During a calibration mode of measuring circuit 300, programmable unity gain amplifier 301 can be programmed to generate a compensation voltage VCOMP that compensates for an offset voltage in comparator 202 between the input terminals of comparator 202. FSM 303 begins the calibration mode of measuring circuit 300 by pulling the OFFSET_CAL_DONE signal to a logic low state. When OFFSET_CAL_DONE is in a logic low state, multiplexer 314 selects the desired internal supply voltage Desired_VCC_INT from node 320 between resistor group 205 and resistor group 206. Multiplexer 314 transmits Desired_VCC_INT from node 320 through its 0 input terminal to the 0 input terminal of multiplexer 311 and the 01 input terminal of multiplexer 313.

FSM 303 generates logic states for the IR_OUT signals during the calibration mode that cause multiplexer 204 to transmit the desired internal supply voltage Desired_VCC_INT from node 320 to the 0 input terminal of multiplexer 312 and the 10 input terminal of multiplexer 313. Initially, FSM 303 causes the OFFSET+ and OFFSET− calibration signals to be in logic low states. When the OFFSET+ calibration signal is in a logic low state, multiplexer 312 transmits the Desired_VCC_INT voltage (VREF) from the output terminal of multiplexer 204 to the non-inverting (+) input terminal of comparator 202. When the OFFSET− calibration signal is in a logic low state, multiplexer 311 transmits the Desired_VCC_INT voltage from the output terminal of multiplexer 314 to the inverting (−) input terminal of comparator 202. When both OFFSET+ and OFFSET− calibration signals are in logic low states, programmable gain amplifier 301 is unused and disabled to save power.

When the voltages at both input terminals of comparator 202 are equal to the Desired_VCC_INT voltage, the output voltage of comparator 202 is indicative of any offset voltage in comparator 202. For example, if comparator 202 has an offset voltage that adds to the voltage at one of its input terminals relative to the voltage at its other input terminal, then the output voltage of comparator 202 is in a logic low state when Desired_VCC_INT is applied to both of its input terminals. An offset voltage in comparator 202 can be caused by process and layout variations in the integrated circuit die.

During the calibration mode, FSM 303 sets the logic states of the OFFSET+ and OFFSET− calibration signals in response to the LOCKED output voltage of comparator 202 to adjust the gain of programmable unity gain amplifier 301 so that amplifier 301 compensates for any offset voltage in comparator 202. For example, if the output voltage of comparator 202 is in a logic low state after the calibration mode begins, FSM 303 can drive the OFFSET+ signal to a logic high state and the OFFSET− signal to a logic low state. While OFFSET+ is high, and OFFSET− is low, multiplexer 313 transmits the Desired_VCC_INT voltage from multiplexer 204 through its 10 input terminal to the VIN input terminal of amplifier 301 as input voltage VSL.

The gain of amplifier 301 is determined by the logic states of the OFFSET+, OFFSET−, and HOLD signals. When amplifier 301 senses logic low states in the HOLD and OFFSET− signals and a logic high state in the OFFSET+ signal, amplifier 301 increases its gain above unity. Amplifier 301 amplifies voltage VSL at input terminal VIN to generate a compensation voltage VCOMP at the output terminal of amplifier 301. Voltage VCOMP is larger than the Desired_VCC_INT voltage from multiplexer 204 by a small amount. Multiplexer 312 transmits the amplified output voltage VCOMP of amplifier 301 to the non-inverting input terminal of comparator 202 in response to a logic high state in OFFSET+. Multiplexer 311 continues to transmit the Desired_VCC_INT voltage from multiplexer 314 to the inverting input terminal of comparator 202 in response to a logic low state in OFFSET−.

FSM 303 then senses whether the output voltage of comparator 202 changes from a logic low state to a logic high state in response to the compensation voltage VCOMP from amplifier 301. If FSM 303 detects the output voltage of comparator 202 changes from a logic low state to a logic high state, then the offset is at the non-inverting input terminal of comparator 202 relative to the inverting input terminal of comparator 202. After the output voltage of comparator 202 changes to a logic high state, FSM 303 causes the HOLD signal to change from a logic low state to a logic high state to signify to programmable amplifier 301 to halt the gain increment at that point. Then, the calibration mode is completed.

If FSM 303 does not detect the output voltage of comparator 202 changing from a logic low state to a logic high state after a predetermined time, the offset is at the inverting input terminal of comparator 202 relative to the non-inverting input terminal of comparator 202. FSM 303 then changes OFFSET+ to a logic low state and OFFSET− to a logic high state. FSM 303 maintains the HOLD signal in a logic low state. In response to a logic low state in OFFSET+, multiplexer 312 transmits voltage VREF to the non-inverting input terminal of comparator 202. In response to a logic high state in the OFFSET− signal, multiplexer 313 transmits the Desired_VCC_INT voltage from multiplexer 314 to the VIN input terminal of amplifier 301 as voltage VSL, amplifier 301 amplifies voltage VSL to generate voltage VCOMP, and multiplexer 311 transmits voltage VCOMP to the inverting input terminal of comparator 202. Programmable amplifier 301 increases its gain above unity again in search of the right amount to compensate the offset. Amplifier 301 may continue to increase its gain as long as one of signals OFFSET+ or OFFSET− is in a logic high state. If FSM 303 detects the output voltage of comparator 202 changing from a logic low state to a logic high state, FSM 303 then changes the HOLD signal from a logic low state to a logic high state to signify to programmable amplifier 301 to halt the gain increment at that point. Then, the calibration mode is completed.

In some embodiments, FSM 303 can add compensation to the inverting input terminal of comparator 202 first. According to some embodiments, FSM 303 can lower the gain of programmable amplifier 301 in search of the right amount of compensation instead of increasing the gain of amplifier 301.

When the calibration mode is completed, FSM 303 pulls the OFFSET_CAL_DONE signal to a logic high state, causing multiplexer 314 to transmit VCC_INT to the 0 input terminal of multiplexer 311 and to the 01 input terminal of multiplexer 313. FSM 303 maintains the OFFSET+, OFFSET−, and HOLD signals in logic states that are selected to cancel out or reduce the offset voltage in comparator 202 after the calibration mode.

FSM 303 resets the binary value of the IR_OUT signals in response to a logic low state in the enable signal IRS_EN. Measuring circuit 300 enters a measurement mode after IRS_EN changes to a logic high state. During the measurement mode, FSM 303 increments or decrements the binary value of the IR_OUT select signals, causing multiplexer 204 to select reference voltages from resistor groups 205 and 206 as VREF in increasing or decreasing order, as described above with respect to FIG. 2.

Using compensation being added to the non-inverting input terminal of comparator 202 as an example, FSM 303 keeps the OFFSET+ and HOLD signals high and the OFFSET− signal low during the measurement mode. As a result, multiplexer 313 transmits the output voltage VREF of multiplexer 204 to the VIN input terminal of amplifier 301, multiplexer 312 transmits the compensation voltage VCOMP from amplifier 301 to the non-inverting input terminal of comparator 202, and multiplexers 311 and 314 transmit VCC_INT to the inverting input terminal of comparator 202. Comparator 202 compares internal supply voltage VCC_INT to each of the reference voltages selected by multiplexer 204 after the reference voltages have been amplified by amplifier 301. Amplifier 301 reduces or cancels the offset voltage in comparator 202. Signals LOCKED and IR_OUT are transmitted to pins 210-211.

Using compensation being added to the inverting input terminal of comparator 202 as another example, FSM 303 keeps the OFFSET+ signal in a logic low state and drives the OFFSET− and HOLD signals to logic high states during measurement mode. As a result, multiplexer 313 transmits the output voltage VCC_INT of multiplexer 314 to the VIN input terminal of amplifier 301, multiplexer 312 transmits VREF to the non-inverting input terminal of comparator 202, and multiplexer 311 transmits VCOMP from amplifier 301 to the inverting input terminal of comparator 202. During the measurement mode, amplifier 301 amplifies VCC_INT to generate the compensation voltage VCOMP. Comparator 202 compares each of the reference voltages selected by multiplexer 204 to the voltage of VCC_INT amplified by amplifier 301. Amplifier 301 reduces or cancels the offset voltage in comparator 202.

Measuring circuit 300 typically calibrates amplifier 301 to compensate for an voltage offset in comparator 202 only one time before VCC_INT is measured. Measuring circuit 300 does not need to perform the calibration mode prior to each measurement of VCC_INT to recalibrate amplifier 301.

Figure 4:
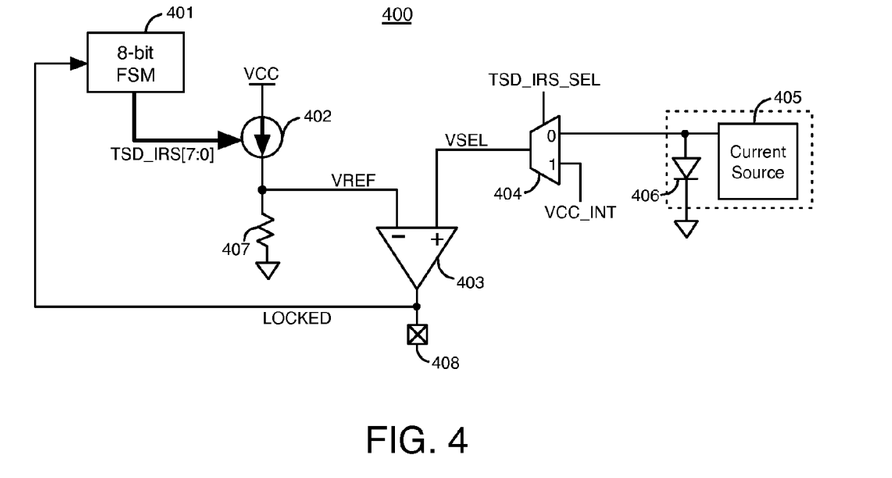
FIG. 4 illustrates an example of circuitry that can measure the internal temperature of an integrated circuit and the supply voltage at an internal node of the integrated circuit, according to another embodiment of the present invention.

FIG. 4 illustrates an example of circuitry that can measure the internal temperature of an integrated circuit and the supply voltage at an internal node of the integrated circuit, according to another embodiment of the present invention. Measuring circuit 400 includes an 8-bit finite state machine (FSM) 401, a programmable current source 402, a voltage comparator 403, a multiplexer 404, a current source 405, a diode 406, a resistor 407, and I/O pin 408. One terminal of resistor 407 is coupled to the inverting input terminal (−) of comparator 403, and the other terminal of resistor 407 receives the ground voltage. Measuring circuit 400 is typically fabricated on an integrated circuit, such as an ASIC or a programmable integrated circuit.

The voltage between programmable current source 402 and resistor 407 is a reference voltage VREF. The reference voltage VREF is transmitted to the inverting (−) input terminal of comparator 403. 8-bit FSM 401 generates 8 TSD_IRS [7:0] control signals. The logic states of the 8 digital TSD_IRS[7:0] control signals determine the amount of current generated by programmable current source 402. The amount of current generated by programmable current source 402 affects the reference voltage VREF. FSM 401 functions as a control circuit.

Multiplexer 404 receives select signal TSD_IRS_SEL at its select input terminal. When TSD_IRS_SEL is in a logic high state, multiplexer 404 transmits an internal supply voltage VCC_INT through its 1 input terminal to the non-inverting input terminal (+) of comparator 403 as voltage VSEL. When TSD_IRS_SEL is in a logic low state, multiplexer 404 transmits the voltage across diode 406 through its 0 input terminal to the non-inverting input terminal of comparator 403 as voltage VSEL. Current source 405 drives a current through diode 406. The voltage across diode 406 at the 0 input terminal of multiplexer 404 is referenced to the ground voltage.

In one embodiment, FSM 401 decreases the binary value of the TSD_IRS[7:0] control signals, causing the current through programmable current source 402 to increase until the reference voltage VREF equals VSEL. In another embodiment, FSM 401 increases the binary value of the TSD_IRS [7:0] control signals, causing the current through programmable current source 402 to decrease until the reference voltage VREF equals VSEL.

Comparator 403 compares voltage VSEL to reference voltage VREF to generate a LOCKED output voltage that is transmitted to I/O pin 408 and FSM 401. The output voltage of comparator 403 is in a logic high state when voltage VSEL equals reference voltage VREF. The output voltage of comparator 403 is in a logic low state when voltage VSEL does not equal reference voltage VREF.

FSM 401 receives the LOCKED output voltage of comparator 403 at an input terminal. When the output voltage of comparator 403 changes from a logic low state to a logic high state, FSM 403 maintains the logic states of the TSD_IRS[7:0] control signals constant. As a result, the final logic states of the TSD_IRS[7:0] control signals are indicative of voltage VSEL, which equals either internal supply voltage VCC_INT or the voltage across diode 406, depending on the logic state of the TSD_IRS_SEL signal.

Figure 5:
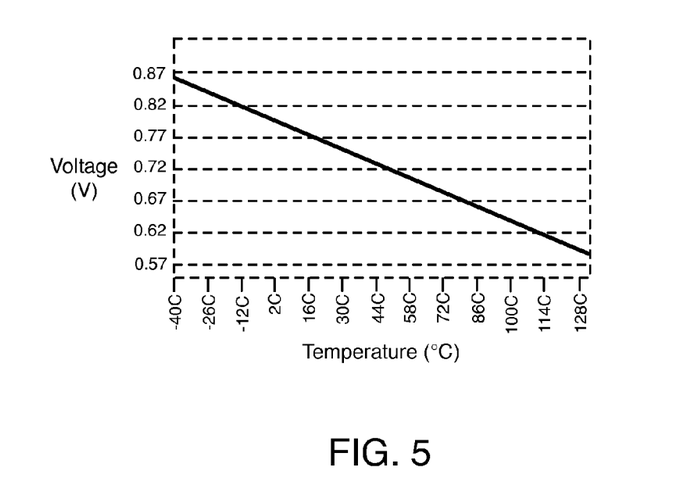
FIG. 5 is a graph that illustrates the voltage across a PN junction diode as a function of the temperature of the diode.

The voltage across a PN junction diode varies as a function of its temperature, as shown in FIG. 5. Each temperature produces a unique voltage across the diode. The voltage across a PN junction diode typically varies linearly across the temperature range shown in FIG. 5. Diode 406 in measuring circuit 400 functions as a temperature sensing diode (TSD). Measuring circuit 400 can compare the voltage across diode 406 to reference voltage VREF, as described above, to generate logic states of the TSD_IRS[7:0] signals that are indicative of the temperature of diode 406 and the temperature of the integrated circuit containing circuit 400. The temperature of a diode is typically an accurate measure of the temperature of the integrated circuit that contains the diode.

Figure 6:
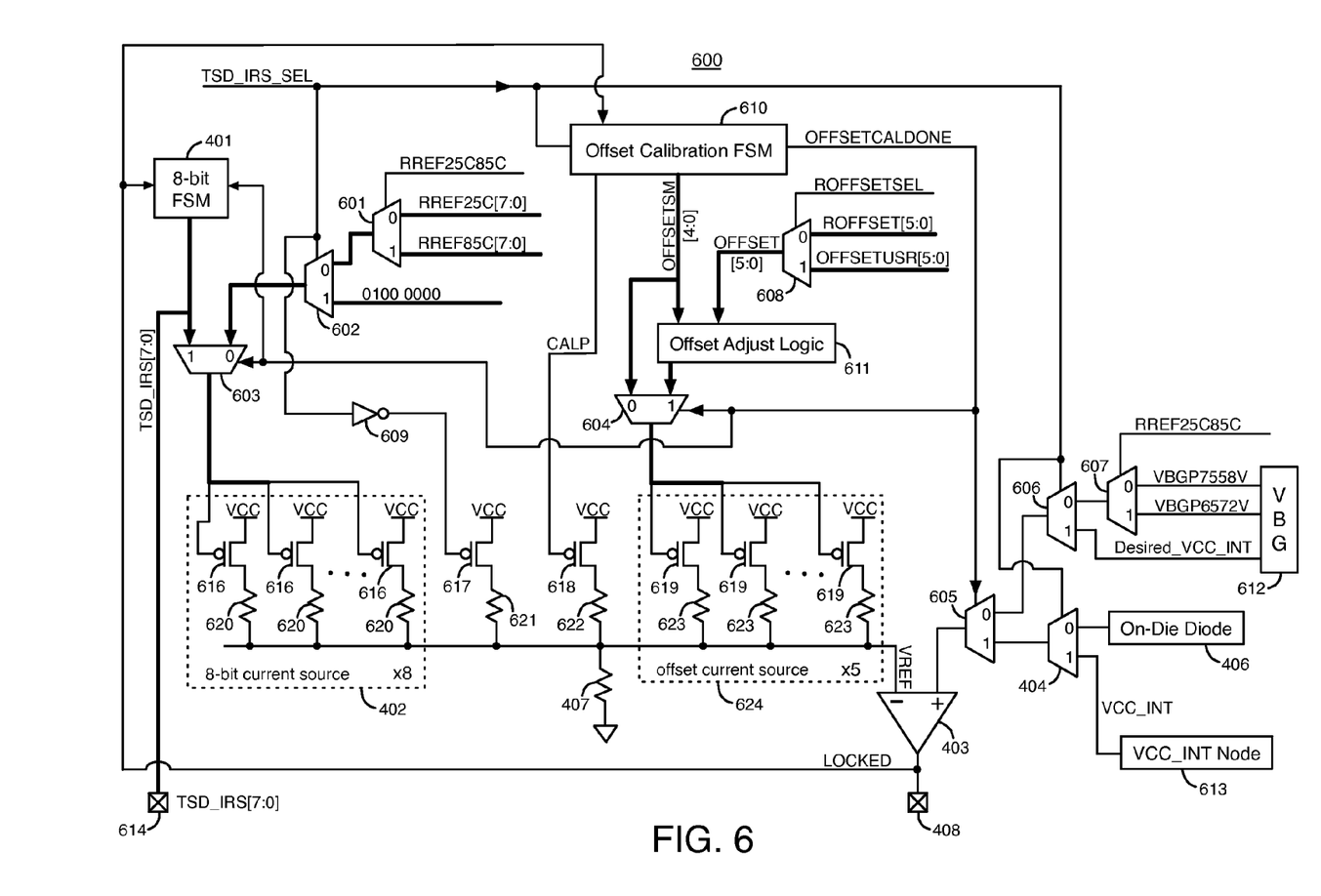
FIG. 6 illustrates an example of a measuring circuit that measures an internal supply voltage or a diode voltage using a comparator and that compensates for a voltage offset between the input terminals of the comparator, according to an embodiment of the present invention.

FIG. 6 illustrates an example of a measuring circuit 600 that measures an internal supply voltage or a diode voltage using a comparator and that compensates for a voltage offset between the input terminals of the comparator, according to an embodiment of the present invention. Measuring circuit 600 as shown in FIG. 6 includes 8-bit finite state machine (FSM) 401, voltage comparator 403, multiplexer 404, diode 406, resistor 407, multiplexers 601-608, inverter 609, offset calibration finite state machine (FSM) 610, offset adjust logic 611, p-channel metal oxide semiconductor field-effect transistors (MOSFETs) 616-619, resistors 620-623, band gap reference voltage divider 612, and input/output (I/O) pins 408 and 614. Measuring circuit 600 is typically fabricated on an integrated circuit, such as an ASIC or a programmable integrated circuit.

Programmable current source 402 includes eight p-channel MOSFETs 616 and eight resistors 620. P-channel MOSFETs 616 are binary weighted. For example, transistors 616 can have relative sizes of 1X, 2X, 4X, 8X, 16X, 32X, 64X, and 128X, where X represents a transistor channel width-to-length ratio. Resistors 620 are also binary weighted, e.g., 1Y, 2Y, 4Y, 8Y, 16Y, 32Y, 64Y, 128Y, where Y represents a resistance value.

Offset current source 624 includes five p-channel MOSFETs 619 and five resistors 623. P-channel transistors 619 are binary weighted. For example, transistors 619 can have relative sizes of 1X, 2X, 4X, 8X, and 16X. Resistors 623 are also binary weighted (e.g., 1Y, 2Y, 4Y, 8Y, 16Y). Each of p-channel transistors 616-619 receives supply voltage VCC at a source terminal and is coupled to one of the resistors. Resistors 620-623 are coupled to the inverting input terminal (−) of comparator 403 and to the p-channel transistors, as shown in FIG. 6.

Measuring circuit 600 can measure the supply voltage VCC_INT at internal node 613 of the integrated circuit that contains circuit 600. Measuring circuit 600 can also measure the voltage across a temperature sensing diode (TSD) 406. Techniques for accurately measuring the voltage across diode 406 or the internal supply voltage VCC_INT are now described.

Process and layout variations in the integrated circuit may cause comparator 403 to have an offset voltage between its inverting (−) and non-inverting (+) input terminals. Measuring circuit 600 contains calibration circuitry that can compensate for an offset voltage between the input terminals of comparator 403 during a calibration mode. The calibration circuitry includes offset calibration FSM 610, offset adjust logic 611, offset current source 624, multiplexers 601-608, transistor 618, and resistor 622.

Offset calibration FSM 610 begins a calibration mode of measuring circuit 600 by pulling the OFFSETCALDONE signal to a logic low state. A logic low state in the OFFSETCALDONE signal causes multiplexers 603-605 to select the voltages at their 0 input terminals. During the calibration mode, offset calibration FSM 610 adjusts the voltage VREF at the inverting (−) input terminal of comparator 403 to compensate for an offset voltage between the input terminals of comparator 403.

Band gap reference voltage divider circuit 612 generates three reference voltages. The three reference voltages are VBGP7558V, VBGP6572V, and Desired_VCC_INT. Band gap reference voltage divider circuit 612 generates these three reference voltages using a resistor divider circuit that receives a band gap voltage VBG from a band gap reference voltage generator. The band gap voltage VBG generated by the band gap reference voltage generator remains substantially constant over an expected range of process, supply voltage, and temperature variations of the integrated circuit. Also, the ratios of the resistors in the resistor divider in band gap reference voltage divider circuit 612 remain substantially constant over an expected range of process, supply voltage, and temperature variations of the integrated circuit. As a result, reference voltages VBGP7558V, VBGP6572V, and Desired_VCC_INT remain substantially constant over the expected range of process, supply voltage, and temperature variations of the integrated circuit.

During the measurement mode, measuring circuit 600 can be used to measure the voltage across diode 406 or the supply voltage VCC_INT at internal node 613 of the integrated circuit that contains circuit 600. A digital signal TSD_IRS_SEL controls whether measuring circuit 600 measures the voltage across diode 406 or the supply voltage VCC_INT at internal node 613 of the integrated circuit. The TSD_IRS_SEL signal is transmitted to the select input terminals of multiplexers 602, 606, and 404. The TSD_IRS_SEL signal is also transmitted to an input terminal of offset calibration FSM 610.

The TSD_IRS_SEL signal is pulled to a logic low state before a measurement of the voltage across diode 406. A logic low state in the TSD_IRS_SEL signal causes multiplexers 602, 606, and 404 to select the voltages at their 0 input terminals. The TSD_IRS_SEL signal is also transmitted to inverter 609. When the TSD_IRS_SEL signal is in a logic low state, the output voltage of inverter 609 is in a logic high state, and p-channel transistor 617 is off.

Measuring circuit 600 is calibrated during a calibration mode after the TSD_IRS_SEL signal is pulled to a logic low state, but before the voltage across diode 406 is measured. Measuring circuit 600 can be calibrated at an expected operating temperature of the integrated circuit that contains circuit 600 during the calibration mode. FIG. 6, for example, contains circuitry that can be used to calibrate circuit 600 at an expected temperature of 25° C. or 85° C.

If a user decides to calibrate circuit 600 using the voltage across diode 406 at 25° C., then a select signal RREF25C85C is pulled to a logic low state. Select signal RREF25C85C controls multiplexers 601 and 607. When the RREF25C85C, TSD_IRS_SEL, and OFFSETCALDONE signals are all in logic low states during the calibration mode, multiplexers 605-607 transmit reference voltage VBGP7558V to the non-inverting (+) input terminal of comparator 403. Reference voltage VBGP7558V has a constant voltage of 0.7558 volts, which is the voltage across diode 406 at a temperature of 25° C. Also, when the RREF25C85C, TSD_IRS_SEL, and OFFSETCALDONE signals are all in logic low states during the calibration mode, multiplexers 601-603 transmit 8-bit reference code RREF25C[7:0] (e.g., 1001 1001) to the gates of transistors 616 in programmable current source 402.

If a user decides to calibrate circuit 600 using the voltage across diode 406 at 85° C., then the select signal RREF25C85C is pulled to a logic high state. When the RREF25C85C signal is in a logic high state, and the TSD_IRS_SEL and OFFSETCALDONE signals are in logic low states during the calibration mode, multiplexers 605-607 transmit reference voltage VBGP6572V to the non-inverting (+) input terminal of comparator 403. Reference voltage VBGP6572V has a constant voltage of 0.6572 volts, which is the voltage across diode 406 at a temperature of 85° C. Also, when the RREF25C85C signal is in a logic high state, and the TSD_IRS_SEL and OFFSETCALDONE signals are in logic low states during the calibration mode, multiplexers 601-603 transmit 8-bit reference code RREF85C[7:0] (e.g., 1101 0101) to the gates of transistors 616 in programmable current source 402.

Either reference voltage VBGP7558V or VBGP6572V is transmitted to the non-inverting input terminal of comparator 403 during a calibration mode that precedes a measurement of the voltage across diode 406.

Each of the 8-bit reference codes RREF25C[7:0] and RREF85C[7:0] have 8 digital signals that are transmitted in parallel through a bus. Each of the multiplexers 601-603 represents eight 2-to-1 multiplexers that are configurable to select the 8 digital signals in one of the 8-bit reference codes.

Measuring circuit 600 can also be used to measure the supply voltage VCC_INT at internal node 613 of the integrated circuit that contains circuit 600. To begin a measurement of internal supply voltage VCC_INT, the TSD_IRS_SEL signal is pulled to a logic high state. When the TSD_IRS_SEL signal is in a logic high state, multiplexers 602, 606, and 404 select the voltages at their 1 input terminals, and the output voltage of inverter 609 is in a logic low state, which causes p-channel transistor 617 to be on.

Measuring circuit 600 is calibrated during a calibration mode after the TSD_IRS_SEL signal is pulled to a logic high state, but before internal supply voltage VCC_INT is measured. When TSD_IRS_SEL is in a logic high state and OFFSETCALDONE is in a logic low state during the calibration mode, multiplexers 605-606 transmit the reference voltage Desired_VCC_INT from circuit 612 to the non-inverting input terminal of comparator 403, and multiplexers 602-603 transmit a predefined 8-bit reference code (e.g., 0100 0000) to the gates of transistors 616 in programmable current source 402.

The 8-bit reference code selected by multiplexer 603 is transmitted to the gates of the eight p-channel transistors 616 in 8-bit current source 402. Each of the 8 digital signals in the 8-bit reference code controls the gate voltage of one of transistors 616. The 8-bit reference code selected by multiplexer 603 turns on one or more of transistors 616 to supply current through resistors 620 and 407. The signals in the 8-bit reference code that are in logic low states turn on the transistors 616 that they control, and the signals in the 8-bit reference code that are in logic high states turn off the transistors 616 that they control.

During the calibration mode, offset calibration FSM 610 turns on one or more of p-channel transistors 618 and 619 to supply current through one or more of resistors 622 and 623, respectively. FSM 610 pulls signal CALP to a logic low state to turn on transistor 618. FSM 610 pulls signal CALP to a logic high state to turn off transistor 618. FSM 610 also generates a 5-bit calibration code OFFSETSM[4:0]. 5-bit calibration code OFFSETSM[4:0] is transmitted to the gates of the five p-channel transistors 619 through multiplexer 604 when the OFFSETCALDONE signal is in a logic low state. Thus, OFFSETSM[4:0] controls the conductive states of transistors 619 during the calibration mode. Each bit in OFFSETSM[4:0] that is in a logic high state turns off a transistor 619, and each bit in OFFSETSM[4:0] that is in a logic low state turns on a transistor 619.

Resistors 620-623 and resistor 407 create a variable resistor divider between supply voltage VCC and ground that functions as a variable voltage divider. The variable resistor divider generates a reference voltage VREF at the inverting input terminal of comparator 403. During the calibration mode, the logic states of the 8-bit reference code selected by multiplexer 603, the CALP signal, the TSD_IRS_SEL signal, and the OFFSETSM[4:0] signals determine the current through transistors 616-619 and resistors 407 and 620-623. The current through transistors 616-619 and resistors 407 and 620-623 determines the reference voltage VREF at the inverting input terminal of comparator 403.

When TSD_IRS_SEL and RREF25C85C are both in logic low states, the 8-bit reference code RREF25C[7:0], the CALP signal, the TSD_IRS_SEL signal, the OFFSETSM[4:0] signals, and the VBGP7558V voltage signal generate a voltage of 0.7558 volts at both input terminals of comparator 403 in the calibration mode prior to measuring the voltage across diode 406. When TSD_IRS_SEL is in a logic low state and RREF25C85C is in a logic high state, the 8-bit reference code RREF85C[7:0], the CALP signal, the TSD_IRS_SEL signal, the OFFSETSM[4:0] signals, and the VBGP6572V voltage signal generate a voltage of 0.6572 volts at both input terminals of comparator 403 in the calibration mode prior to a measurement of the voltage across diode 406.

When TSD_IRS_SEL is in a logic high state, the 8-bit reference code 0100 0000, the CALP signal, the TSD_IRS_SEL signal, the OFFSETSM[4:0] signals, and the Desired_VCC_INT voltage signal generate a voltage equal to the Desired_VCC_INT voltage (e.g., 0.9 volts) at both input terminals of comparator 403 during the calibration mode prior to a measurement of VCC_INT. Thus, the voltages transmitted to both input terminals of comparator 403 during the calibration mode are the same voltage.

Transistor 617 and resistor 621 are added to circuit 600 to increase the reference voltage VREF at the inverting input terminal of comparator 403 during the supply voltage calibration mode and the supply voltage measurement mode.

The offset calibration FSM 610 adjusts the conductive states of transistors 619 using the 5-bit digital offset code OFFSETSM[4:0] during the calibration mode to compensate for an offset voltage between the input terminals of comparator 403. The output voltage of comparator 403 is indicative of any offset voltage in comparator 403 during the calibration mode. The 5-bit digital offset code OFFSETSM[4:0] output by offset calibration FSM 610 generates one of 32 different current settings for offset current source 624. A change in the binary value of 5-bit digital offset code OFFSETSM[4:0] either increases or decreases voltage VREF at the inverting input terminal of comparator 403 by changing the current setting for offset current source 624.

FSM 610 senses the LOCKED output voltage of comparator 403 during the calibration mode. If the reference voltage VREF at the inverting input terminal of comparator 403 is initially not equal to the band gap reference voltage from circuit 612 at the non-inverting input terminal of comparator 403, the LOCKED output voltage of comparator 403 is in a logic low state, and FSM 610 changes the binary value of the OFFSETSM[4:0] digital code to equalize reference voltage VREF with the band gap reference voltage from circuit 612. The LOCKED output voltage of comparator 403 is in a logic high state when the voltages at its input terminals are equal.

After the LOCKED output voltage of comparator 403 toggles from a logic low state to a logic high state during the calibration mode, FSM 610 ends the calibration mode and begins the measurement mode by pulling the OFFSETCAL-DONE signal to a logic high state. After the calibration mode, the logic states of the OFFSETSM[4:0] signals generate an offset current in current source 624 that compensates for any offset voltage between the input terminals of comparator 403. During the measurement mode, FSM 610 maintains the OFFSETSM[4:0] signals in constant logic states.

When the OFFSETCALDONE signal is in a logic high state during the measurement mode, multiplexer 605 transmits the output signal of multiplexer 404 to the non-inverting input terminal of comparator 403. If the TSD_IRS_SEL signal is in a logic low state, then multiplexer 404 transmits the voltage across diode 406 to the non-inverting input terminal of comparator 403. If the TSD_IRS_SEL signal is in a logic high state, then multiplexer 404 transmits internal supply voltage VCC_INT from internal node 613 to the non-inverting input terminal of comparator 403.

Also, multiplexer 604 transmits the 5-bit output code of offset adjust logic 611 to the gates of transistors 619 when the OFFSETCALDONE signal is in a logic high state. When OFFSETCALDONE is high, offset adjust logic 611 transmits either the OFFSETSM[4:0] code or an adjusted code to the gates of transistors 619. Offset adjust logic 611 generates the adjusted code by adding to or subtracting from the binary value of the OFFSETSM[4:0] code. Offset adjust logic 611 receives a 6-bit code OFFSET[5:0] from multiplexer 608. One bit OFFSET[5] of the 6-bit code OFFSET[5:0] indicates whether to add or subtract from the binary value of OFFSETSM[4:0]. The remaining 4 bits OFFSET[4:0] of the OFFSET[5:0] code indicate the binary value to add to or subtract from the binary value of OFFSETSM[4:0]. Multiplexer 608 selects either the ROFFSET[5:0] code or the OFFSETUSR [5:0] code as the OFFSET[5:0] code in response to select signal ROFFSETSEL. Thus, the logic signals in the OFFSETSM[4:0] code (or a user adjusted code) control the conductive states of transistors 619 during the measurement mode based on the binary value of the OFFSETSM[4:0] code that was selected by FSM 610 during the calibration mode.

In addition, when the OFFSETCALDONE signal is in a logic high state, multiplexer 603 transmits the 8-bit control code TSD_IRS[7:0] to the gates of transistors 616 during the measurement mode. Control code TSD_IRS[7:0] then controls the conductive states of transistors 616 in programmable current source 402. 8-bit FSM 401 is enabled when the OFFSETCALDONE signal transitions to a logic high state. When FSM 401 is enabled, FSM 401 resets the binary value of the control code TSD_IRS[7:0] to a default binary value (e.g., 00000000 or 11111111). FSM 401 then decreases (or increases) the binary value of control code TSD_IRS[7:0] in each subsequent time interval to increase (or decrease) the current through programmable current source 402, until FSM 401 senses a change in the LOCKED output voltage of comparator 403 from a logic low state to a logic high state. Comparator 403 and FSM 401 together form an analog-to-digital converter circuit.

The LOCKED output voltage of comparator 403 is in a logic high state when reference voltage VREF at its inverting input terminal is equal to the voltage at its non-inverting input terminal (i.e., the voltage across diode 406 or VCC_INT during measurement mode). After the LOCKED output voltage of comparator 403 changes from a logic low state to a logic high state, FSM 401 maintains the signals in control code TSD_IRS[7:0] in constant logic states. The logic states of the 8-bit control code TSD_IRS[7:0] generated by FSM 401 after the LOCKED output voltage changes from a logic low state to a logic high state are indicative of either the voltage across diode 406 or the internal supply voltage VCC_INT, depending on the logic state of TSD_IRS_SEL. For example, if TSD_IRS_SEL is a logic high and the binary value of control code TSD_IRS[7:0] is greater than 01000000, then VCC_INT is greater than the Desired_VCC_INT voltage. As another example, if TSD_IRS_SEL is a logic high and the binary value of control code TSD_IRS[7:0] is less than 01000000, then VCC_INT is less than the Desired_VCC_INT voltage.

The control code TSD_IRS[7:0] is transmitted to 8 output pins 614 of the integrated circuit for analysis. Output pins 614 are driven by circuitry in the input/output elements (IOEs). Output pins 614 do not need to be dedicated pins. Output pins 614 can be pins that are shared by programmable logic blocks in an FPGA. For example, multiplexers can be configured to transmit either control code TSD_IRS[7:0] or digital signals from programmable logic blocks to output pins 614.

The 8-bit code TSD_IRS[7:0] generated by FSM 401 allows for 256 possible combinations for the conductive states of transistors 616. Thus, 8-bit control code TSD_IRS [7:0] can generate 256 different voltages for VREF. FSM 401 can generate a very finely tuned reference voltage VREF in order to determine the voltage at the non-inverting input terminal of comparator 403 within a high degree of precision. For example, the voltage across diode 406 varies from 0.570 to 0.870 volts across the temperature range shown in FIG. 5. This voltage range equals a change of 300 mV. Therefore, 256 different voltages for VREF corresponds to a voltage change of about 1 mV in VREF in response to each increase (or decrease) of 1 in the binary value of 8-bit control code TSD_IRS[7:0].

Programmable current source 402, offset current source 624, and the current sources formed by transistors 617-618 and resistors 621-622 are non-ideal current sources. Therefore, the currents generated by these current sources change in response to variations in the process, the supply voltage, and the temperature of circuit 600. If the temperature of circuit 600 changes during the operation of circuit 600, then the current through transistors 616-619 may change in response to the temperature change. Because the temperature of measuring circuit 600 may have changed since the last calibration mode, measuring circuit 600 is recalibrated before each measurement of the voltage across diode 406 or the internal supply voltage VCC_INT. Measuring circuit 600 is recalibrated by performing the calibration mode again. FSM 610 begins the calibration mode by pulling the OFFSETCALDONE signal to a logic low state. FSM 610 then readjusts the logic states of the signals that control the gate voltages of transistors 618-619 during the calibration mode to compensate for the offset voltage between the input terminals of comparator 403, as described above.

Figure 7:
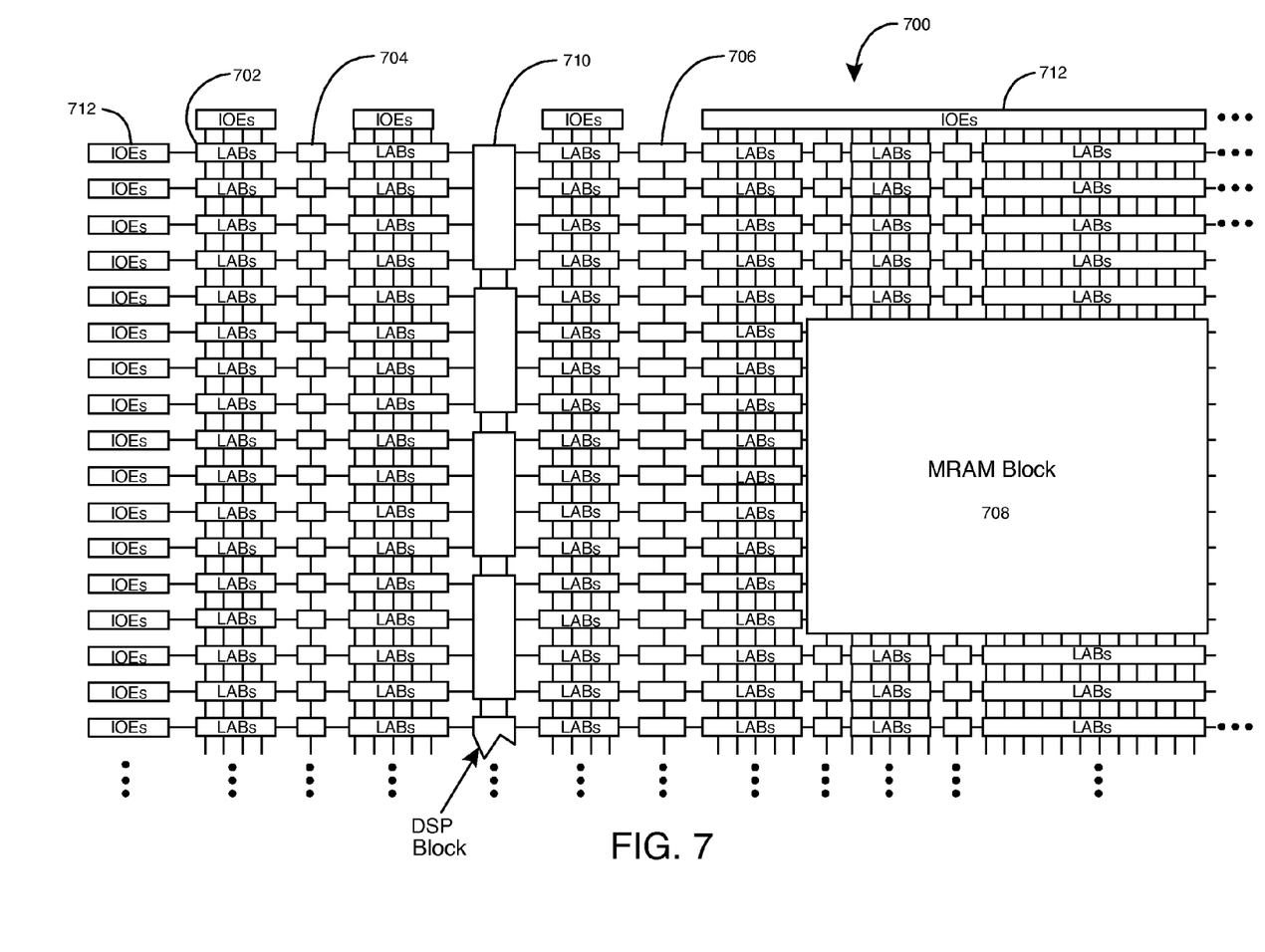
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. Input/output elements (IOEs) 712 located, in this example, around the periphery of the chip support numerous single-ended and differential input/output standards. Each IOE 712 is coupled to an external terminal (i.e., a pin) of FPGA 700. For example, a subset of the IOEs 712 can be coupled to pins 408 and 614. It is to be understood that FPGA 700 is described herein for illustrative purposes only and that the present invention can be implemented in many different types of PLDs, FPGAs, and ASICs.

Figure 8:
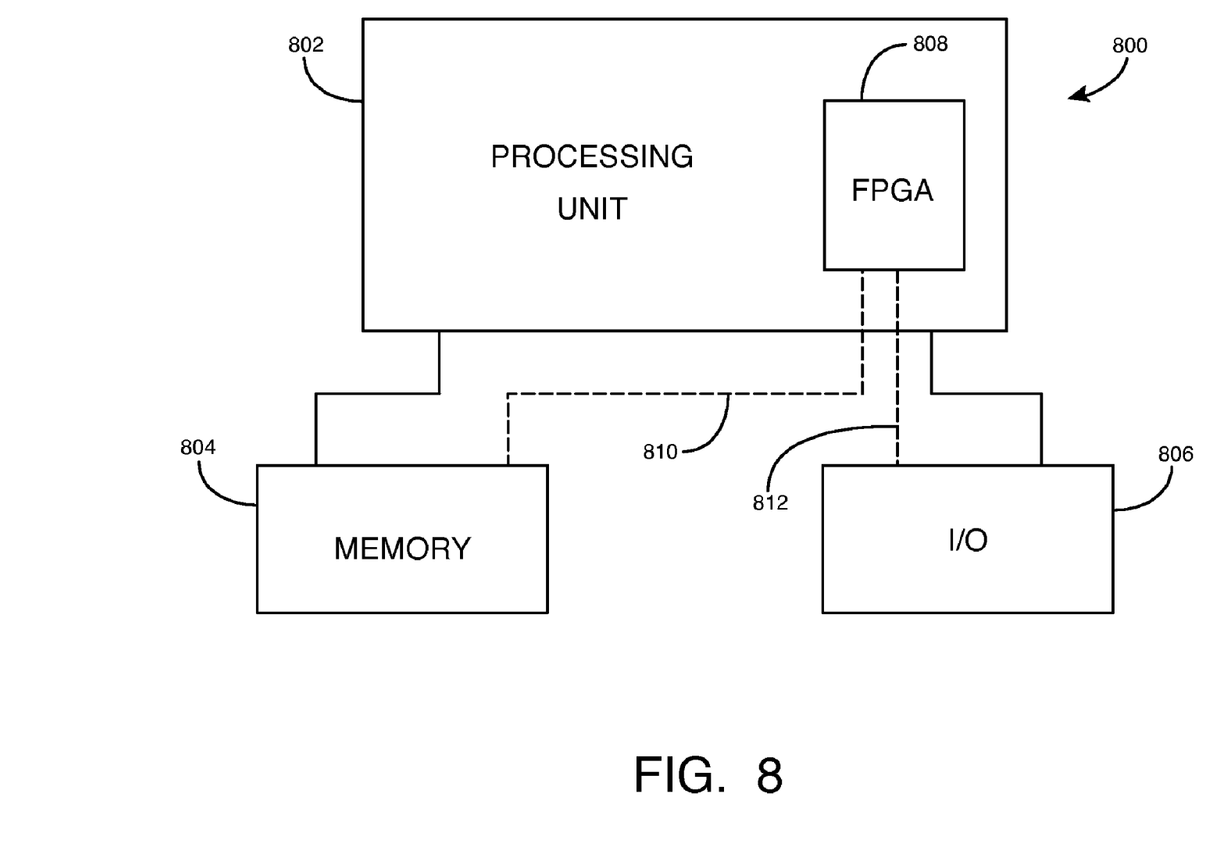
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor that can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a comparator operable to measure an internal voltage of the circuit based on a selected reference voltage;
a resistor divider operable to generate reference voltages;
a control circuit operable to generate a select signal based on an output signal of the comparator;
a first multiplexer operable to select one of the reference voltages from the resistor divider as the selected reference voltage based on the select signal; and
a programmable gain amplifier configurable to generate a compensation voltage to compensate for an offset voltage of the comparator, wherein the compensation voltage is provided to an input of the comparator.

2. The circuit of claim 1, wherein the programmable gain amplifier is operable to generate the compensation voltage based on the selected reference voltage or the internal voltage.

3. The circuit of claim 2 further comprising:
a second multiplexer operable to provide the selected reference voltage or the internal voltage to an input of the programmable gain amplifier.

4. The circuit of claim 1 further comprising:
a band gap reference voltage generator operable to generate a band gap reference voltage, wherein the band gap reference voltage is provided to the resistor divider.

5. The circuit of claim 1, wherein the control circuit is a finite state machine operable to adjust the select signal in response to an enable signal until the finite state machine senses a change in the output signal of the comparator.

6. The circuit of claim 1, wherein the circuit is in an integrated circuit.

7. The circuit of claim 1, wherein a gain of the programmable gain amplifier is adjusted to compensate for the offset voltage of the comparator during a calibration mode based on a first calibration signal generated by the control circuit.

8. The circuit of claim 7 further comprising:
a second multiplexer operable to provide the selected reference voltage or the internal voltage to an input of the programmable gain amplifier in response to the first calibration signal.

9. The circuit of claim 8 further comprising:
a third multiplexer operable to provide the compensation voltage or the selected reference voltage to a first input of the comparator in response to the first calibration signal; and a fourth multiplexer operable to provide the compensation voltage or the internal voltage to a second input of the comparator in response to a second calibration signal generated by the control circuit, and wherein the gain of the programmable gain amplifier is programmable based on the first and the second calibration signals.

10. A method for measuring an internal voltage of a circuit, the method comprising:
measuring the internal voltage of the circuit based on a selected reference voltage to generate a comparison signal using a comparator;
generating reference voltages;
generating a select signal based on the comparison signal;
selecting one of the reference voltages as the selected reference voltage based on the select signal; and
generating a compensation voltage that compensates for an offset voltage in the comparator, wherein the compensation voltage is provided to an input of the comparator.

11. The method of claim 10, wherein generating a compensation voltage that compensates for an offset voltage in the comparator comprises generating the compensation voltage using a programmable gain amplifier based on the selected reference voltage or the internal voltage during a measurement mode.

12. The method of claim 11 further comprising:
providing a desired internal supply voltage or the selected reference voltage to an input of the programmable gain amplifier during a calibration mode using a first multiplexer.

13. The method of claim 12 further comprising:
adjusting a gain of the programmable gain amplifier based on the comparison signal during the calibration mode to generate a voltage for the compensation voltage that compensates for the offset voltage in the comparator.

14. The method of claim 10, wherein generating a select signal based on the comparison signal comprises generating select signals based on the comparison signal using a finite state machine that adjusts the select signals in response to an enable signal until the finite state machine senses a logic state change in the comparison signal.

15. The method of claim 13 further comprising:
providing the compensation voltage or the selected reference voltage to a first input of the comparator in response to a first calibration signal using a second multiplexer; and
providing the compensation voltage or the internal voltage to a second input of the comparator in response to a second calibration signal using a third multiplexer, wherein a gain of the programmable gain amplifier is programmable in response to the first and the second calibration signals.

16. A circuit comprising:
a comparator operable to measure an internal voltage of the circuit based on a selected reference voltage;
a resistor divider operable to generate reference voltages;
a control circuit operable to generate a select signal based on an output signal of the comparator;
a first multiplexer operable to select one of the reference voltages from the resistor divider as the selected reference voltage based on the select signal; and
an amplifier configurable to generate a compensation voltage to compensate for an offset voltage of the comparator based on the selected reference voltage or the internal voltage, wherein the compensation voltage is provided to an input of the comparator.

17. The circuit of claim 16 further comprising:
a second multiplexer operable to receive the selected reference voltage at a first input and the internal voltage at a second input, wherein the second multiplexer provides a selected signal to the input of the amplifier based on a first calibration signal.

18. The circuit of claim 17 further comprising:
a third multiplexer operable to receive the compensation voltage at a first input and the internal voltage at a second input, wherein a signal selected by the third multiplexer is provided to a first input of the comparator based on the first calibration signal.

19. The circuit of claim 18 further comprising:
a fourth multiplexer operable to receive the compensation voltage at a first input and the selected reference voltage at a second input, wherein a signal selected by the fourth multiplexer is provided to a second input of the comparator based on a second calibration signal, and wherein a gain of the amplifier is programmable based on the first and the second calibration signals.

20. The circuit of claim 16 further comprising:
a second multiplexer operable to receive an internal supply voltage at a first input and a desired internal supply voltage from the resistor divider at a second input, wherein the second multiplexer generates the internal voltage at an output.

* * * * *